(12) United States Patent
Lee

(10) Patent No.: US 7,166,510 B2
(45) Date of Patent: Jan. 23, 2007

(54) METHOD FOR MANUFACTURING FLASH MEMORY DEVICE

(75) Inventor: Young Bok Lee, Ichon-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 11/018,701

(22) Filed: Dec. 21, 2004

(65) Prior Publication Data

US 2005/0221558 A1 Oct. 6, 2005

(30) Foreign Application Priority Data

Mar. 30, 2004 (KR) ...................... 10-2004-0021780

(51) Int. Cl.
*H01L 21/336* (2006.01)
(52) U.S. Cl. ...................... 438/257; 438/261; 438/263; 438/264; 257/E21.682; 257/E21.684; 257/E21.688
(58) Field of Classification Search ................ 438/257, 438/261, 263, 264
See application file for complete search history.

(56) References Cited

U.S. PATENT DOCUMENTS

| | | | | |
|---|---|---|---|---|
| 5,210,056 | A * | 5/1993 | Pong et al. | 438/773 |
| 5,756,385 | A * | 5/1998 | Yuan et al. | 438/258 |
| 6,013,551 | A * | 1/2000 | Chen et al. | 438/264 |
| 6,218,689 | B1 * | 4/2001 | Chang et al. | 257/288 |
| 6,239,044 | B1 * | 5/2001 | Kashiwagi et al. | 438/787 |
| 6,790,728 | B1 * | 9/2004 | Dong et al. | 438/257 |
| 6,812,515 | B1 * | 11/2004 | Rabkin et al. | 257/315 |

OTHER PUBLICATIONS

Dr. Srini Raghavan, Wet Etching and Cleaning: Surface Considerations and Process Issues, 1999, Arizona Board of Regents for The University of Arizona.*

* cited by examiner

*Primary Examiner*—Michael Lebentritt
*Assistant Examiner*—Kyoung Lee
(74) *Attorney, Agent, or Firm*—Marshall, Gerstein & Borun LLP

(57) ABSTRACT

A method for manufacturing a flash memory device including the steps of forming a gate oxide film for high voltage on the whole surface of a semiconductor substrate on which a cell region, a low voltage region and a high voltage region have been formed, etching the gate oxide film for high voltage formed in the cell region and the low voltage region by a predetermined depth, by forming photoresist patterns to expose the gate oxide film for high voltage formed in the cell region and the low voltage region, and performing a wet etching process using the photoresist patterns as an etching mask, removing the entire gate oxide film for high voltage formed in the cell region and the low voltage region, by performing a cleaning process on the resulting structure, removing the photoresist patterns, forming a floating gate electrode and a control gate electrode, by sequentially forming a tunnel oxide film, a first polysilicon film, a second polysilicon film, a dielectric film, a third polysilicon film and a metal silicide film on the whole surface of the resulting structure, and patterning the resulting structure, and forming source and drain regions, by implanting ions by using the gate electrodes as an ion implant mask.

12 Claims, 5 Drawing Sheets

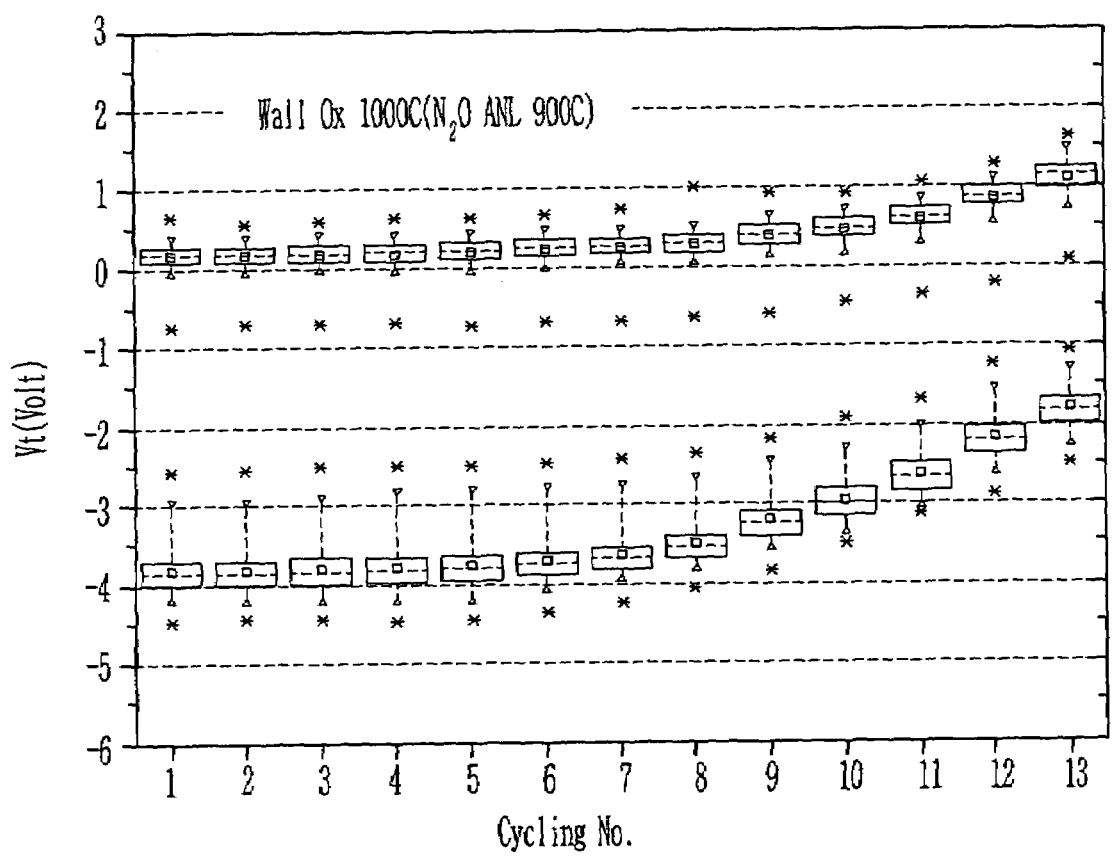

METHOD FOR MANUFACTURING FLASH MEMORY DEVICE

BACKGROUND

1. Field of the Invention

The present invention relates to a method for manufacturing a semiconductor device, and more particularly to, a method for manufacturing a flash memory device.

2. Discussion of Related Art

A process for forming a tunnel oxide film of a flash memory device forms a gate oxide film for high voltage on the whole surface of a semiconductor substrate, removes the gate oxide film for high voltage formed in a cell region and a low voltage region, and forms an appropriate thickness of tunnel oxide film in the cell region and the low voltage region.

However, the general process for removing the gate oxide film for high voltage formed in the cell region and the low voltage region does not completely remove the gate oxide film for the high voltage. The residual gate oxide film for high voltage deteriorates quality of the tunnel oxide film and uniformity of a thickness thereof.

There are thus increasing demands for a method for manufacturing a flash memory device which does not have detrimental effects on quality of the tunnel oxide film and uniformity of the thickness thereof.

SUMMARY OF THE INVENTION

The present invention is directed to a method for manufacturing a flash memory device which does not have detrimental effects on quality of a tunnel oxide film and uniformity of a thickness thereof.

One aspect of the invention is to provide a method for manufacturing a flash memory device, the method including forming a gate oxide film for high voltage on the whole surface of a semiconductor substrate on which a cell region, a low voltage region and a high voltage region have been formed; forming photoresist patterns on the high voltage region to expose the gate oxide film for high voltage formed in the cell region and the low voltage region; performing a first removal step to etch the gate oxide film for high voltage formed in the cell region and the low voltage region by a predetermined depth to provide the gate oxide film of a predetermined thickness, by performing a wet etching process using the photoresist patterns as an etching mask; performing a second removal step to remove the entire gate oxide film for high voltage formed in the cell region and the low voltage region, by performing a cleaning process on the resulting structure; removing the photoresist patterns; sequentially forming a tunnel oxide film, a first polysilicon film, a second polysilicon film, a dielectric film, a third polysilicon film and a metal silicide film on the whole surface of the resulting structure, forming a floating gate electrode and a control gate electrode by patterning the resulting structure; and forming source and drain regions, by implanting ions by using the gate electrodes as an ion implant mask.

Preferably, the gate oxide film for high voltage is formed at a thickness of 300 to 400 Å, by performing a wet oxidation process at a temperature of 750 to 800° C. and an $N_2$ annealing process at a temperature of 900 to 910° C. for 20 to 30 minutes.

Preferably, the wet etching process is performed by using an etching solution prepared by mixing BOE, $H_2SO_4$ and SC-1($NH_4OH/H_2O_2/H_2O$), so that the gate oxide film for high voltage can be left at a thickness of 15 to 45 Å.

Preferably, the cleaning process is performed by using DHF and SC-1($NH_4OH/H_2O_2/H_2O$).

Preferably, the tunnel oxide film is formed at a thickness of 70 to 100 Å, by forming a pure oxide film at a thickness of 60 to 90 Å by performing a wet oxidation process at a temperature of 750 to 800° C. and an $N_2$ annealing process at a temperature of 900 to 910° C. for 20 to 30 minutes, and by performing a nitridation process using $N_2O$ gas annealing on the resulting film at a temperature of 800 to 1000° C. for 10 to 30 minutes.

Preferably, the method for manufacturing the flash memory device further includes the steps of: forming a trench, by patterning the first polysilicon film, the tunnel oxide film and a predetermined depth of semiconductor substrate in order to define an element isolation region on the resulting structure on which the first polysilicon film has been formed; and forming an element isolation film by filling an oxide film in the trench, prior to the step for forming the second polysilicon film.

Preferably, the method for manufacturing the flash memory device further includes a step for forming an oxide film on the sidewalls of the trench at a temperature of 800° C. before filling the oxide film in the trench.

BRIEF DESCRIPTION OF THE DRAWINGS

FIGS. 5A, 6A and 7A are graphs showing properties of a conventional tunnel oxide film.

DETAILED DESCRIPTION OF PREFERRED EMBODIMENTS

Figure 1:
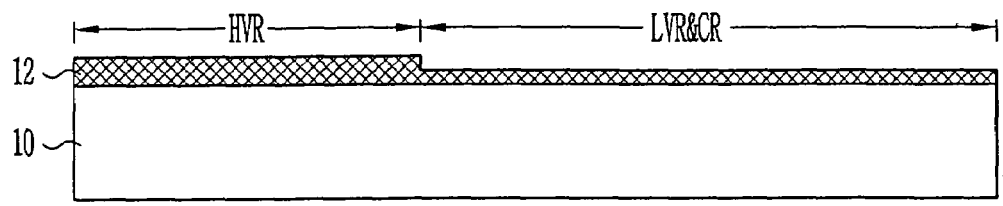
FIGS. 1 to 4 are cross-sectional diagrams illustrating sequential steps of a method for manufacturing a flash memory device in accordance with a preferred embodiment of the present invention.

A method for manufacturing a flash memory device in accordance with a preferred embodiment of the present invention will now be described in detail with reference to the accompanying drawings. The embodiment of the present invention can be modified in various forms, which is not intended to be limiting. The embodiment of the present invention is provided to fully explain the present invention to the ordinary people in the art to which the present invention pertains. In the drawings, a thickness of each film is exaggerated to provide clear and accurate explanations. Wherever possible, the same reference numerals will be used throughout the drawings and the description to refer to the same or like parts. In the case that it is described that one film is disposed on or contacts another film or a semiconductor substrate, one film can directly contact another film or the semiconductor substrate, or the third film can be positioned between them.

FIGS. 1 to 4 are cross-sectional diagrams illustrating sequential steps of the method for manufacturing the flash memory device in accordance with the preferred embodiment of the present invention.

Referring to FIG. 1, an ion implant process for forming wells on PMOS and NMOS regions and an ion implant process for controlling a threshold voltage are performed on a predetermined region of a semiconductor substrate 10 according to a photoetching process, thereby forming a well region (not shown) and a region (not shown) implanted with ions for controlling the threshold voltage in each region. The PMOS region, namely, the region on which a P-type transistor is formed, the NMOS region, namely, the region on which an N-type transistor is formed, a cell region (CR), a high voltage region (HVR) and a low voltage region (LVR) are defined on the semiconductor substrate 10.

On the other hand, in the well region, a P well is formed in a triple N well. Here, an ion implant dopant for forming the well region in the PMOS region is prepared by using B ions and implanted at a dose of 1.0E13 to 3.0E13 with an energy of 500 to 600 KeV, at a dose of 1.0E13 to 3.0E12 with an energy of 200 to 300 KeV, and at a dose of 2.0E12 to 7.0E12 with an energy of 50 to 200 KeV, and an ion implant dopant for forming the well region in the NMOS region is prepared by using P ions and implanted at a dose of 1.0E13 to 3.0E13 with an energy of 1.0 to 2.0 MeV. In addition, an ion implant angle of each region is tilted at an angle of 0 to 45° and twisted at an angle of 0 to 270°.

When the process for forming the well region (not shown) which forms the P well in the triple N well is finished, the region (not shown) implanted with the ions for controlling the threshold voltage is formed at a dose of 5.0E12 to 8.0E12 with an energy of 30 to 70 KeV and at a dose of 5.0E12 to 8.0E14 with an energy of 10 to 30 KeV. An ion implant angle of each region is tilted at an angle of 0 to 45° and twisted at an angle of 0 to 270°.

A gate oxide film 12 for high voltage is formed on the top surface of the semiconductor substrate 10 on which the region (not shown) implanted with the ions for controlling the threshold voltage has been formed. Preferably, the gate oxide film 12 for high voltage is formed at a thickness of 60 to 90 Å, by performing a wet oxidation process at a temperature of 750 to 800° C. and an $N_2$ annealing process at a temperature of 900 to 910° C. for 20 to 30 minutes. Thereafter, photoresist patterns (not shown) are formed by performing a photoetching process, so that the gate oxide film 12 for high voltage can be left merely in the HVR. The gate oxide film 12 for high voltage formed in the CR and the LVR is removed by performing an etching process using the photoresist patterns (not shown) as an etching mask. Here, the gate oxide film 12 for high voltage formed in the CR and the LVR is firstly removed by performing a wet etching process using an etching solution prepared by mixing BOE, $H_2SO_4$ and SC-1($NH_4OH/H_2O_2/H_2O$), so that the gate oxide film 12 for high voltage can be left at a thickness of 15 to 45 Å. The photoresist patterns (not shown) are removed according to an etching process.

Figure 2:
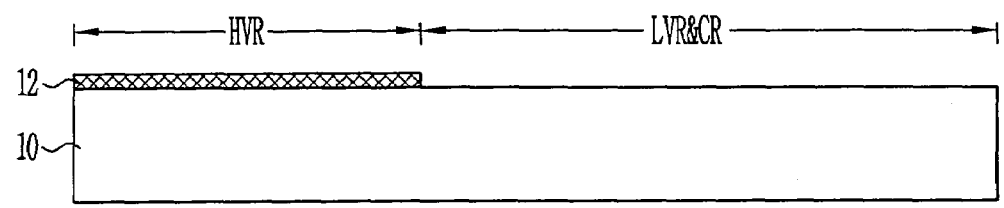

As shown in FIG. 2, the gate oxide film 12 for high voltage left in the CR and the LVR at a thickness of 15 to 45 Å is secondly removed by performing a cleaning process on the resulting structure on which the gate oxide film 12 for high voltage has been removed by a predetermined thickness. The cleaning process is performed by using DHF (50:1) and SC-1($NH_4OH/H_2O_2/H_2O$).

The method for manufacturing the flash memory device does not have detrimental effects on quality of a tunnel oxide film and uniformity of a thickness thereof, by removing the gate oxide film for high voltage formed in the CR and the LVR by a predetermined thickness according to the wet etching process, and completely removing the residual gate oxide film for high voltage according to the cleaning process.

Figure 3:
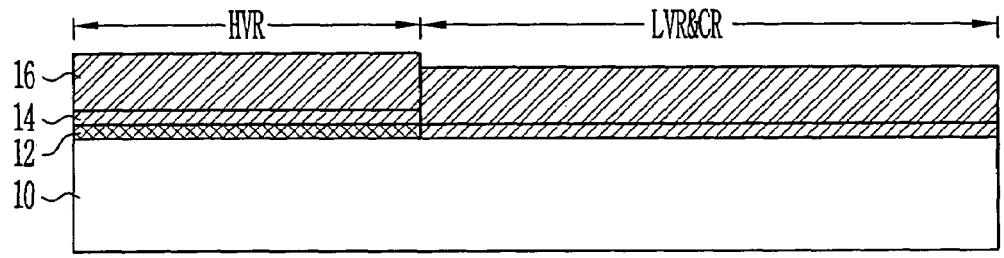

As illustrated in FIG. 3, a tunnel oxide film 14, a first polysilicon film 16 for a floating gate electrode, and a pad nitride film (not shown) are formed on the resulting structure.

Preferably, the tunnel oxide film 14 is formed at a thickness of 70 to 100 Å, by forming a pure oxide film at a thickness of 60 to 90 Å by performing a wet oxidation process at a temperature of 750 to 800° C. and an $N_2$ annealing process at a temperature of 900 to 910° C. for 20 to 30 minutes, and by performing a nitridation process using $N_2O$ gas annealing on the resulting film at a temperature of 800 to 1000° C. for 10 to 30 minutes.

Since the nitridation process is performed during the process for forming the tunnel oxide film 14, data retention fail properties which deteriorate properties of the tunnel oxide film 14 are prevented. As a result, quality of the tunnel oxide film 14 is improved.

The first polysilicon film 16 used as a part of the floating gate electrode is formed at a thickness of 200 to 800 Å at a temperature of 530 to 680° C. under a pressure of 0.1 to 3 torr. A grain size of the first polysilicon film 16 is minimized to prevent electric field concentration.

The pad nitride film (not shown) is formed at a thickness of 500 to 100 Å.

A trench (not shown) for defining an element isolation region is formed by performing a photoetching process on a predetermined region of the pad nitride film (not shown). After forming the trench (not shown), an oxidation process for forming a sidewall oxide film is performed to compensate for etching damages on the sidewalls of the trench (not shown), thereby forming the oxide film on the sidewalls of the trench (not shown). The oxidation process for forming the sidewall oxide film is performed at a temperature of 800° C., which prevents deterioration of properties of the tunnel oxide film 14. Therefore, data retention properties of the tunnel oxide film 14 improved by the nitridation process are preserved.

An element isolation film (not shown) is formed by depositing an HDP oxide film on the trench (not shown), performing a planarization process such as a CMP process, and removing the pad nitride film (not shown).

Figure 4:
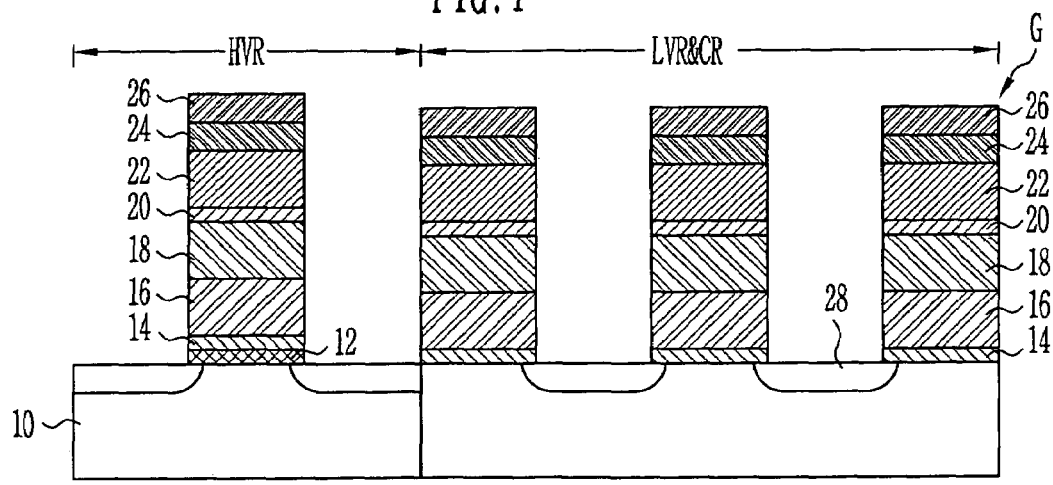

As depicted in FIG. 4, a second polysilicon film 18 for a floating gate electrode, a dielectric film 20 having an ONO structure, a third polysilicon film 22 for a control gate electrode, a tungsten silicide film 24 and a hard mask 26 are sequentially formed on the whole surface of the semiconductor substrate 10 on which the tunnel oxide film 14, the first polysilicon film 16 and the element isolation film (not shown) have been formed.

The second polysilicon film 18 is formed at a thickness of 1000 to 2000 Å.

The ONO dielectric film 20 is comprised of a first oxide film formed at a thickness of 40 to 60 Å at a temperature of 800 to 850° C. by using a DCS-HTO oxide film, a nitride film formed at a thickness of 40 to 80 Å at a temperature of 600 to 700° C. by using a nitride film, and a second oxide film formed at a thickness of 40 to 60 Å at a temperature of 800 to 850° C. by using a DCS-HTO oxide film.

The third polysilicon film 22 is formed at a thickness of 500 to 2000 Å with an ion concentration of 0.5e20 to 5.0e20 at a temperature of 400 to 500° C.

The tungsten silicide film 24 is formed at a thickness of 500 to 2000 Å at a temperature of 400 to 500° C.

The hard mask 26 is formed by sequentially forming a PE-TEOS oxide film at a thickness of 800 to 2000 Å and an arcoxynitride film at a thickness of 300 to 1500 Å.

Thereafter, photoresist patterns (not shown) for forming a gate electrode are formed on the resulting semiconductor substrate 10. Floating gate electrode patterns and control gate electrode patterns G are formed respectively by performing an etching process using the photoresist patterns (not shown) as an etching mask.

Source and drain regions 28 are formed to overlap with the floating gate electrode patterns, by implanting ions into the semiconductor substrate 10 by using the gate electrode patterns G as an ion implant mask, thereby finishing the whole process. The source and drain regions 28 can be formed at a dose of 2.0E12 to 8.0E14 with an energy of 5 to 30 KeV. Here, an ion implant angle of the region is tilted at an angle of 0 to 45° and twisted at an angle of 0 to 270°.

The method for manufacturing the flash memory device in accordance with the present invention has the following advantages.

First, uniformity of accumulative probability is achieved in CCST properties (checking properties of the tunnel oxide film by applying a predetermined stress) for the tunnel oxide film, by improving interface properties between the tunnel oxide film and the first polysilicon film by preventing damages of the semiconductor substrate.

Figure 5A:
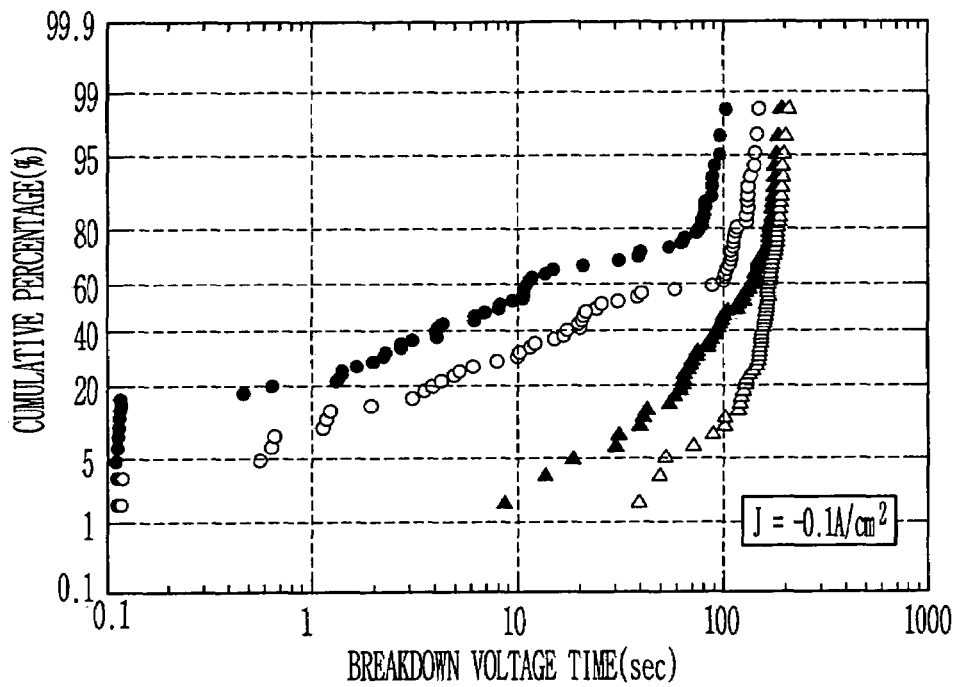

Referring to FIG. 5A, in the conventional art, the gate oxide film for high voltage must be removed before forming the tunnel oxide film in the CR and the LVR. An etching time excessively increases to completely remove the gate oxide film for high voltage left in the CR and the LVR, which damages the semiconductor substrate and deteriorates the interface properties between the tunnel oxide film and the first polysilicon film. Therefore, uniformity of accumulative probability is not achieved in the CCST properties for the tunnel oxide film.

Figure 5B:
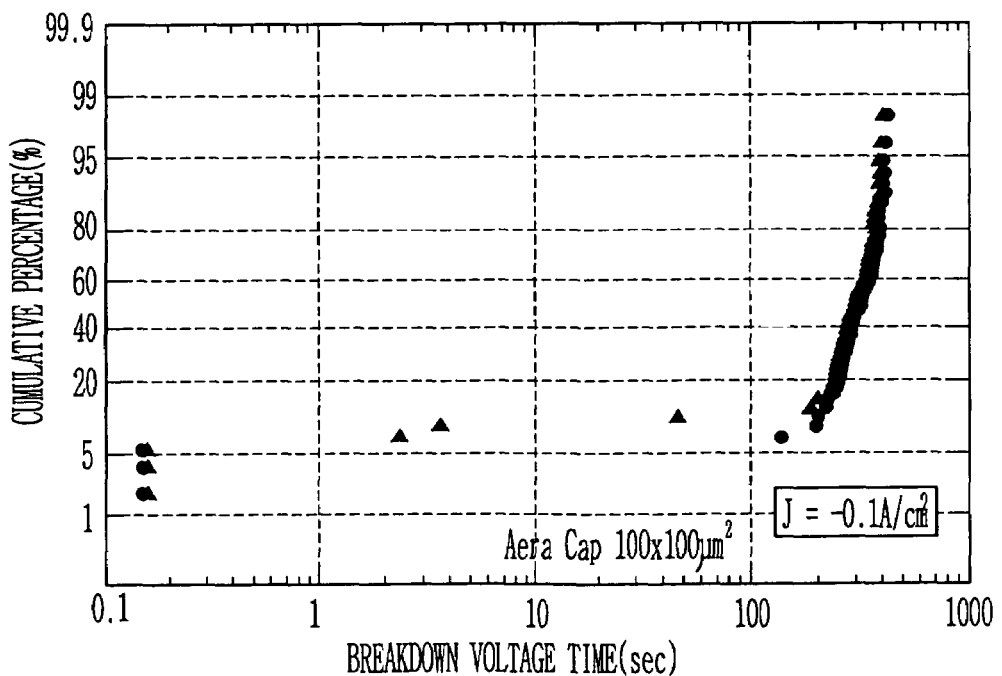
FIGS. 5B, 6B and 7B are graphs showing properties of a tunnel oxide film in accordance with the present invention.

In accordance with the present invention, the residual tunnel oxide film is appropriately controlled by adjusting the etching time of the tunnel oxide film formation region in the CR and the LVR, and removed according to the cleaning process in the formation of the tunnel oxide film. Accordingly, as shown in FIG. 5B, uniformity of accumulative probability is achieved in the CCST properties for the tunnel oxide film, by improving the interface properties between the tunnel oxide film and the first polysilicon film by preventing damages of the semiconductor substrate.

Second, cell cycling properties and retention properties are improved due to improvements of properties of the tunnel oxide film.

Figure 6A:
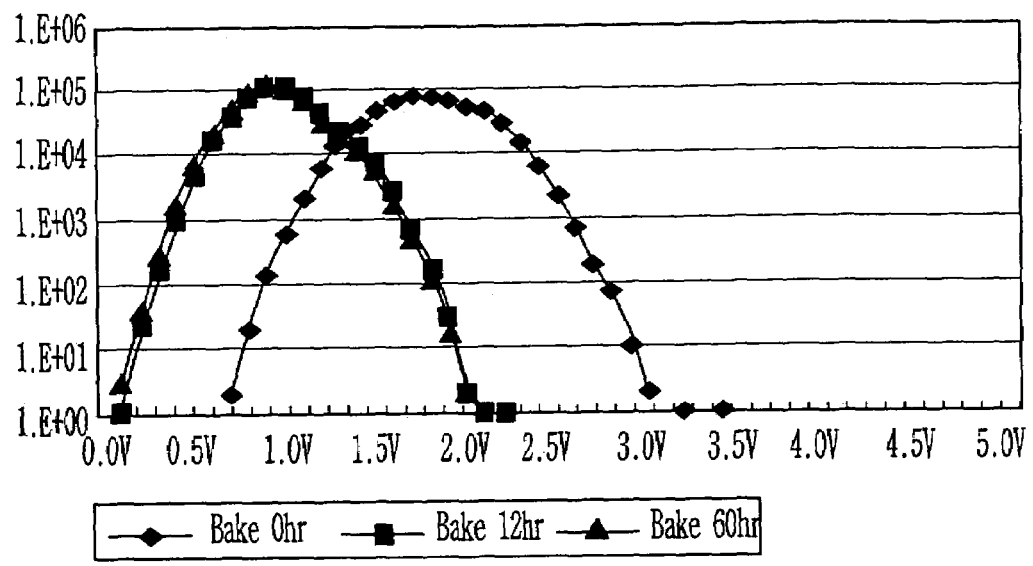

FIG. 6A shows conventional bake retention test results recorded after erase/write cycling to obtain early reliability for data retention. In order to obtain reliability for the data retention, program Vt is transferred in the bake retention by 1.0V after 10K cycling. Here, program Vt conditions range from 1.0 to 3.0V, and distribution of the currently-programmed cell is 1.5V. That is, a Vt transfer margin is only 0.5V, which causes failure. Although not illustrated, the same problem occurs in the erase operation. Since the program and erase operations are repeated after 10K erase and write cycling, electrons trapped inside the tunnel oxide film are detrapped, and the threshold voltage Vt is excessively transferred, to deteriorate bake retention properties.

Figure 6B:
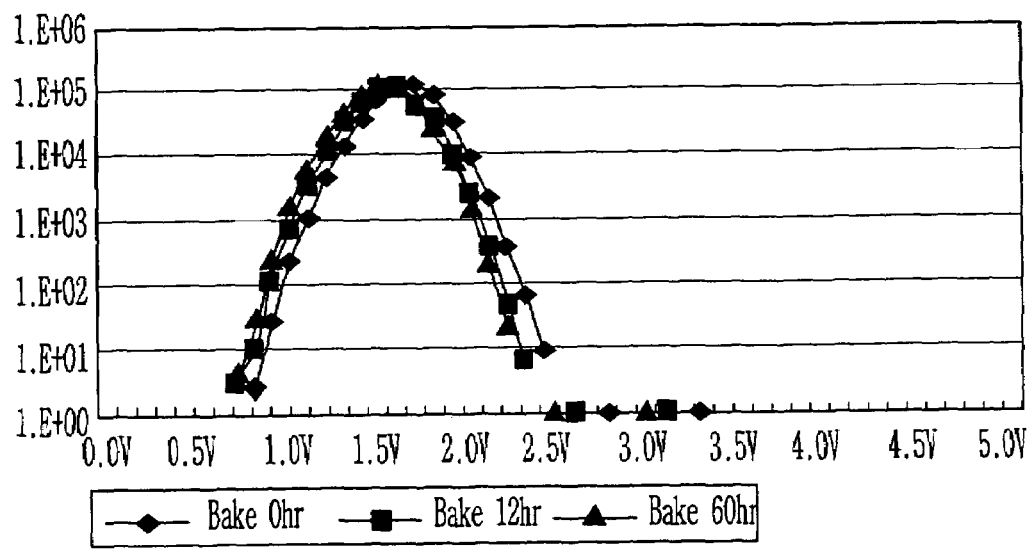

FIG. 6B shows bake retention test results recorded after erase/write cycling to obtain early reliability for data retention in accordance with the present invention. Since the program and erase operations are repeated after 10K erase and write cycling, detrapping of the electrons trapped inside the tunnel oxide film and excessive transfer of the threshold voltage Vt are prevented, to improve bake retention properties.

Figure 7B:
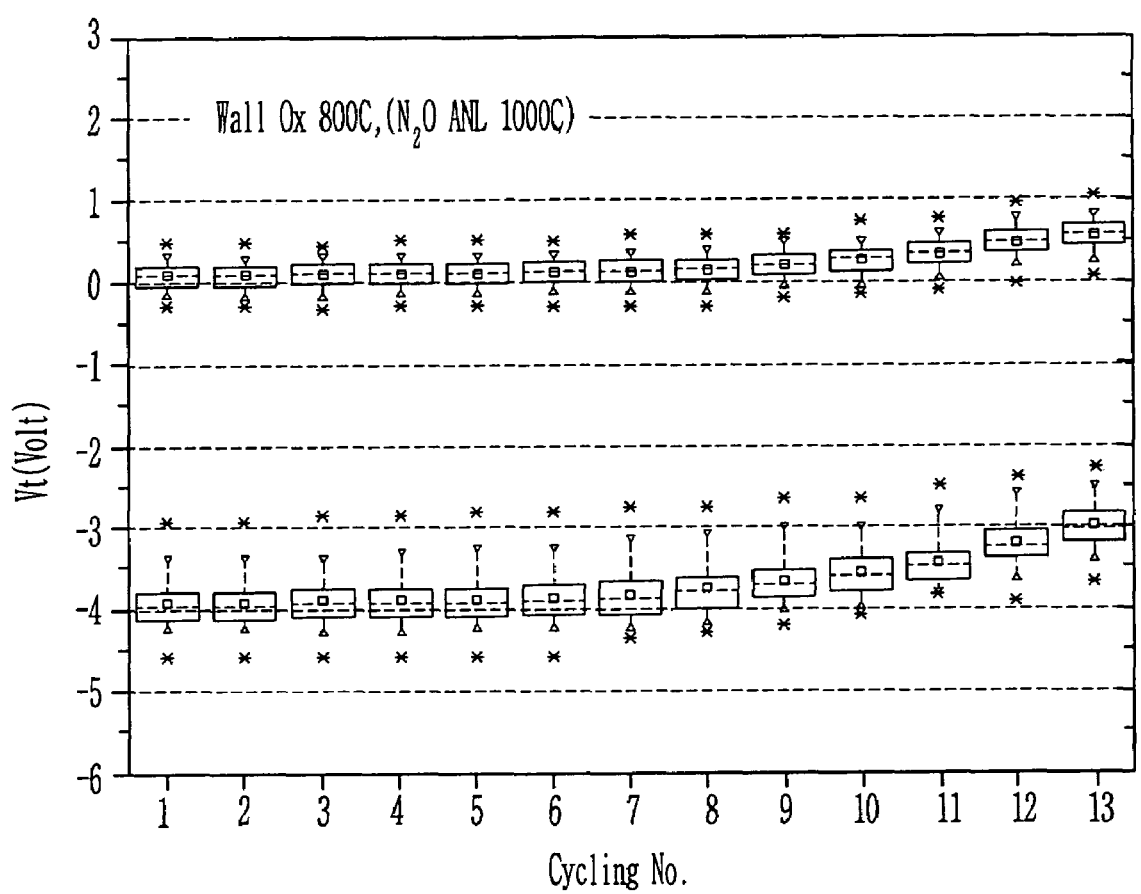

As illustrated in FIG. 7A, in the conventional art, the threshold voltage Vt is excessively transferred due to movement of the electrons trapped in the tunnel oxide film after erase/write cycling. Accordingly, cycling properties of the tunnel oxide film are deteriorated. Conversely, as shown in FIG. 7B, in accordance with the present invention, cycling properties of the tunnel oxide film are not deteriorated after erase/write cycling.

In accordance with the present invention, the method for manufacturing the flash memory device does not have detrimental effects on quality of the tunnel oxide film and uniformity of the thickness thereof, by removing the gate oxide film for high voltage formed in the CR and the LVR by a predetermined thickness according to the wet etching process, and completely removing the residual gate oxide film for high voltage according to the cleaning process.

As discussed earlier, in accordance with the present invention, the method for manufacturing the flash memory device does not have detrimental effects on quality of the tunnel oxide film and uniformity of the thickness thereof, by removing the gate oxide film for high voltage formed in the CR and the LVR by a predetermined thickness according to the wet etching process, and completely removing the residual gate oxide film for high voltage according to the cleaning process.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method for manufacturing a flash memory device, the method comprising the steps of:

forming a gate oxide film for high voltage on the whole surface of a semiconductor substrate on which a cell region, a low voltage region and a high voltage region have been formed;

forming photoresist patterns on the high voltage region to expose the gate oxide film for high voltage formed in the cell region and the low voltage region;

performing a first removal step to etch the gate oxide film for high voltage formed in the cell region and the low voltage region by a predetermined depth to provide the gate oxide film of a predetermined thickness, by performing a wet etching process using the photoresist patterns as an etching mask;

performing a second removal step to remove the entire gate oxide film for high voltage formed in the cell region and the low voltage region, by performing a cleaning process on the resulting structure;

removing the photoresist patterns;

sequentially forming a tunnel oxide film, a first polysilicon film, a second polysilicon film, a dielectric film, a third polysilicon film and a metal suicide film on the whole surface of the resulting structure;

forming a floating gate electrode and a control gate electrode by patterning the resulting structure; and forming source and drain regions, by implanting ions by using the gate electrodes as an ion implant mask.

2. The method of claim 1, comprising forming the gate oxide film for high voltage at a thickness of 300Å to 400Å, by performing a wet oxidation process at a temperature of 750° C. to 800° C. and an $N_2$ annealing process at a temperature of 900° C. to 910° C. for 20 minutes to 30 minutes.

3. The method of claim 1, comprising performing the wet etching process by using an etching solution prepared by mixing BOE, $H_2SO_4$ and SC-1($NH_4OH/H_2O_2/H_2O$), so that the gate oxide film for high voltage van be left at a thickness of 15Å to 45Å.

4. The method of claim 1, comprising performing the cleaning process by using DHF and SC-1($NH_4OH/H_2O_2/H_2O$).

5. The method of claim 1, comprising forming the tunnel oxide film at a thickness of 70Å to 100Å, by forming a pure oxide film at a thickness of 60Å to 90Å by performing a wet oxidation process at a temperature of 750° C. to 800° C. and an $N_2$ annealing process at a temperature of 900° C. to 910° C. for 20 minutes to 30 minutes, and by performing a nitridation process using $N_2O$ gas annealing on the resulting film at a temperature of 800° C. to 1000° C. for 10 minutes to 30 minutes.

6. The method of claim 1, further comprising the steps of:
forming a trench, by patterning the first polysilicon film, the tunnel oxide film and a predetermined depth of semiconductor substrate in order to define an element isolation region on the resulting structure on which the first polysilicon film has been formed; and
forming an element isolation film by filling an oxide film in the trench, prior to the step for forming the second polysilicon film.

7. The method of claim 6, further comprising a step for forming an oxide film on the sidewalls of the trench at a temperature of 800° C. before filling the oxide film in the trench.

8. A method for manufacturing a flash memory device, the method comprising the steps of:
forming a gate oxide film on a semiconductor substrate including a cell region, a low voltage region and a high voltage region;
etching a portion of the gate oxide film in the cell region and the low voltage region to provide the gate oxide film of a predetermined thickness;
removing the remaining gate oxide film in the cell region and the low voltage region;
forming a pure oxide film on the semiconductor substrate by a wet oxidation process at a first temperature;
performing a nitridation process on the pure oxide film using $N_2O$ gas at a second temperature higher than the first temperature, thereby forming a tunnel oxide film;
sequentially forming a first polysilicon film and a pad nitride film;
forming a trench by etching a portion of the first polysilicon film, the pad nitride film, and the semiconductor substrate;
performing an oxidation process at a third temperature lower than the second temperature for forming a sidewall oxide film on the trench;
forming an element isolation film in the trench;
removing the nitride film;
sequentially forming a dielectric film, a second polysilicon film, and a metal silicide film on an entire structure including the element isolation film;
patterning the metal silicide film, the second polysilicon film, the dielectric film and the first polysilicon film, thereby forming a floating gate and a control gate; and
forming source and drain regions.

9. The method of claim 8, wherein the first temperature is in the range of 750° C. to 800° C. and the second temperature is in the range of 800° C. to 1000° C.

10. The method of claim 8, wherein the third temperature is about 800° C.

11. The method of claim 8, further comprising the step of performing an annealing process using $N_2$ gas at a temperature of 900° C. to 910° C. between the wet oxidation process and the nitridation process.

12. The method of claim 8, comprising etching the portion of the gate oxide film by a wet etching process and removing the remaining gate oxide film by a cleaning process.

* * * * *